(12) United States Patent
Popov (10) Patent No.: US 11,694,423 B2
(45) Date of Patent: Jul. 4, 2023

(54) GATED TRUNCATED READOUT SYSTEM

(71) Applicant: JEFFERSON SCIENCE ASSOCIATES, LLC, Newport News, VA (US)

(72) Inventor: Vladimir Popov, Newport News, VA (US)

(73) Assignee: Jefferson Science Associates, LLC, Newport News, VA (US)

( * ) Notice: Subject to any disclaimer, the term of this patent is extended or adjusted under 35 U.S.C. 154(b) by 725 days.

(21) Appl. No.: 16/656,740

(22) Filed: Oct. 18, 2019

(65) Prior Publication Data

US 2021/0117734 A1   Apr. 22, 2021

(51) Int. Cl.
  *G06K 9/62*   (2022.01)
  *G06T 3/40*   (2006.01)
  (Continued)

(52) U.S. Cl.
  CPC ....... *G06K 9/6272* (2013.01); *G01R 33/5608* (2013.01); *G06K 9/0051* (2013.01); *G06T 3/4061* (2013.01); *G06V 10/30* (2022.01); *G16Y 40/10* (2020.01); *G16Y 40/20* (2020.01); *H04N 5/378* (2013.01)

(58) Field of Classification Search
  CPC .. G06K 9/6272; G06K 9/0051; G06K 9/0053; G06V 10/764; G06V 10/30; G06V 10/955; G01T 1/161; G01T 1/164; G01T 1/1644; G01T 1/208; G01T 1/248; G01T 1/2018; G01T 1/2985; H04N 5/378; G01R 33/5608; G06T 3/4061; G16Y 40/10; G16Y 40/20
  See application file for complete search history.

(56) References Cited

U.S. PATENT DOCUMENTS 3,264,541 A  *  8/1966  Mell  .............. G01G 23/37
                                                318/400.29
6,740,859 B1    5/2004  Wojcik et al.
(Continued)

OTHER PUBLICATIONS

R. Wojcik, S. Majewski, B. Kross, D. Steinbach and A. G. Weisenberger, "High spatial resolution gamma imaging detector based on a 5" diameter R3292 Hamamatsu PSPMT," in IEEE Transactions on Nuclear Science, vol. 45, No. 3, pp. 487-491, Jun. 1998, doi: 10.1109/23.682432. (Year: 1998).*

*Primary Examiner* — John P. Dulka (57) ABSTRACT

A gated truncated readout system for position sensitive or imaging detectors that improves resolution over traditional readout systems. The readout system includes two or more amplifiers that receive a multichannel output analog data from the detector. Analog gates control circuitry, included in the readout circuit, receives the signals from the amplifiers, determines a fractional value of the sum-integral of the signals, and enables analog gates operation around an area of interest, disabling all other channels where noise dominates the signal value and thereby improving interpolation accuracy of the signals centroid position and the detector resolution. Filtered signals are transmitted to a centroid interpolation signal processing device for computation of the centroid position. As a result disabling all channels where noise dominates the signal value, the gated truncated readout system provides better accuracy improved detector resolution.

9 Claims, 5 Drawing Sheets

(51) Int. Cl.

| | |
|---|---|
| *G16Y 40/10* | (2020.01) |
| *G16Y 40/20* | (2020.01) |
| *G01R 33/56* | (2006.01) |
| *H04N 5/378* | (2011.01) |
| *G06V 10/30* | (2022.01) |
| *G06K 9/00* | (2022.01) |

(56) References Cited

U.S. PATENT DOCUMENTS

| | | | |
|---|---|---|---|
| 6,747,263 B1* | 6/2004 | Popov | H01J 43/00 |
| | | | 250/207 |
| 9,817,134 B1* | 11/2017 | Fu | G01T 1/2018 |
| 2009/0037126 A1* | 2/2009 | Mott | G01T 1/171 |
| | | | 356/326 |
| 2016/0170045 A1* | 6/2016 | Kim | G01T 1/2018 |
| | | | 250/208.1 |
| 2018/0038966 A1* | 2/2018 | Fu | G01T 1/2018 |
| 2020/0046240 A1* | 2/2020 | Angle | A61B 5/7267 |

* cited by examiner

GATED TRUNCATED READOUT SYSTEM

The United States Government may have certain rights to this invention under Management and Operating Contract No. DE-AC05-06OR23177 from the Department of Energy.

FIELD OF THE INVENTION

The present invention relates to readout systems for position sensitive detectors including radiation imaging detectors or 2-D position sensitive detectors and, more specifically, relates to multichannel analog data readout systems where it is important to filter-reject any part of the data which include more noise than signal in order to provide improved resolution accuracy and lead to better image or position contrast.

BACKGROUND

A large variety of position sensitive detectors (PSDs) are available commercially, such as multi-anode or position sensitive photomultipliers (PS-PMT's), PMTs array, and semiconductor sensors array or multi-output position sensitive solid state detectors Many of above mentioned detectors are used with a specific interpolation algorithm for finding the centroid from many inputs of acquired analog data.

Figure 1:
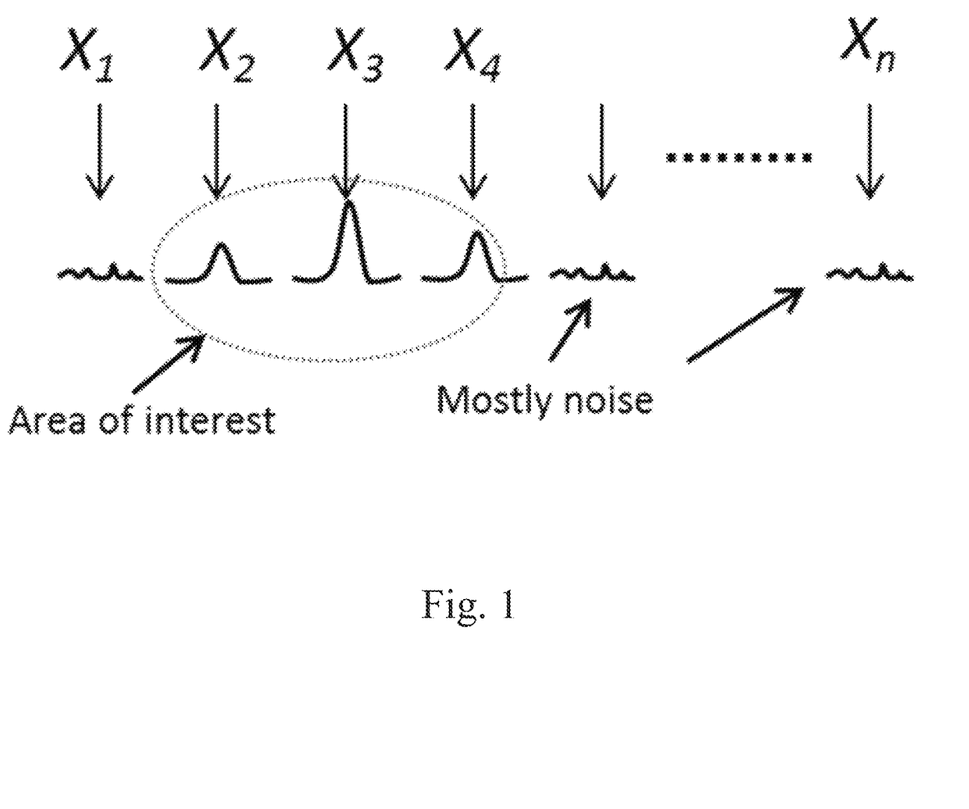
FIG. 1 depicts a position sensitive detector with "n" analog data outputs. In the event most of data appeared in the "area of interest", while most of the other inputs generate mostly noise.

With reference to FIG. 1, a conventional one-dimensional centroid position-finding algorithm or "center-of-gravity" (COG) computation may include the following formula:

$$X = \frac{\sum_i i \cdot X_i}{\sum_i X_i}, \quad (1)$$

where "X" is interpolated centroid position, "Xi" is a signal amplitude acquired from channel i, "i" is a number of the signal channel which may have a value from 1 to "n", and "n" is the number of the last readout channel.

Using the center-of-gravity algorithm in equation (1), most of the useful data can be seen in the area of interest and all other outputs generate mostly noise. However, executing the algorithm causes the noise from remote outputs to get larger weighting coefficients which unfortunately "pull" the COG position out of its real location, degrading the accuracy of the COG determination.

Figure 2A:
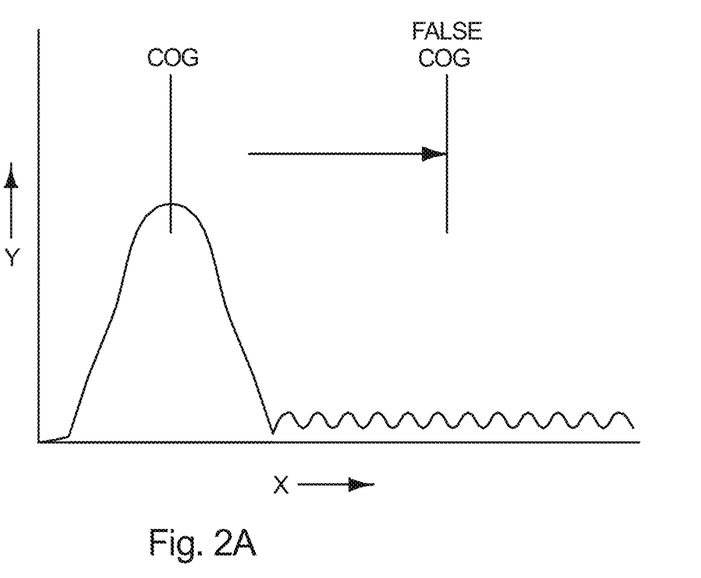
FIG. 2A depicts the deleterious effect on a center-of-gravity determination as a result of thermal noise. The useful output is on the left side of the X-axis and the outputs on the right side of the X-axis generate mostly noise. However, the noise improperly gets a larger weighting coefficient and thus pulls the determined COG position out of its real location, creating a false COG determination.
Figure 2B:
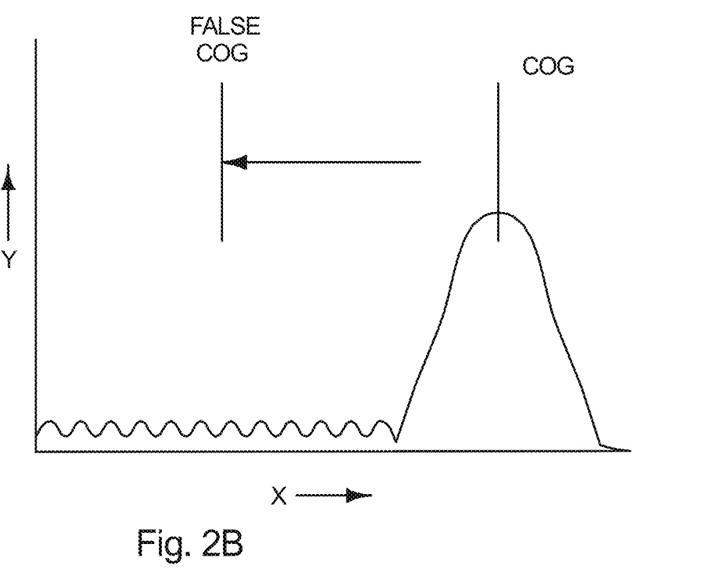
FIG. 2B depicts the same deleterious effect on a center-of-gravity determination as a result of thermal noise, but with the useful output on the right side of the X-axis and the outputs on the left side of the X-axis generating mostly noise. In this case, the noise improperly pulls the determined COG position to the left side of its real location.

An example of the deleterious effect on a center-of-gravity determination as a result of thermal noise can be seen in FIGS. 2A and 2B. In FIG. 2A, the useful output is on the left side of the X-axis and the outputs on the right side of the X-axis generate mostly noise. However, the noise improperly gets a larger weighting coefficient and thus pulls the determined COG position out of its real location, creating a false COG determination to the right of the actual position.

FIG. 2B depicts the same deleterious effect on a center-of-gravity determination as a result of thermal noise, but with the useful output on the right side of the X-axis and the outputs on the left side of the X-axis generating mostly noise. In this case, the noise improperly pulls the determined COG position to the left side of its real location.

Accordingly, there is a need to reduce or eliminate the errors inherent in conventional COG determinations and thus improve the position resolution enhancement of detectors and other position-detecting devices.

OBJECTS AND ADVANTAGES OF THE INVENTION

The object of the present invention is to provide an improved readout system for position sensitive detectors including radiation imaging detectors or 2-D position sensitive detectors.

A further objective is to reduce or eliminate the errors inherent in conventional COG determinations and thus improve the position resolution enhancement of detectors and other position-detecting devices.

These and other objects and advantages of the present invention will be understood by reading the following description along with reference to the drawings.

SUMMARY OF THE INVENTION

The present invention is a gated truncated readout system for position sensitive or imaging detectors that improves resolution over traditional readout systems. The readout system includes two or more amplifiers that receive a multichannel output analog data from the detector. Analog gates control circuitry, included in the readout circuit, receives the signals from the amplifiers, determines a fractional value of the sum-integral of the signals, and enables analog gates operation around an area of interest, disabling all other channels where noise dominates the signal value and thereby improving interpolation accuracy of the signals centroid position and the detector resolution. Filtered signals are transmitted to a centroid interpolation signal processing device for computation of the centroid position. As a result disabling all channels where noise dominates the signal value, the gated truncated readout system provides better accuracy improved detector resolution.

BRIEF DESCRIPTION OF THE SEVERAL VIEWS OF THE DRAWING(S)

Reference is made herein to the accompanying drawings, which are not necessarily drawn to scale, and wherein.

DETAILED DESCRIPTION

The present invention relates to readout systems for position sensitive detectors including radiation imaging detectors or 2-D position sensitive detectors. More specifically, it relates to multichannel analog data readout systems where it is important to filter or reject the part of the data which include more noise than signal. Filtering or rejecting the noise provides improved resolution accuracy, expands the sensitive area, and leads to better image or position contrast. It is applicable to a large variety of position sensitive detectors, such as multi-anode or position sensitive photomultipliers (PS-PMT's), PMT arrays, semiconductor sensor arrays, and multi-output position sensitive solid state detectors.

The current invention proposes sorting or filtering signals acquired from the outputs of the detectors. It includes a sum of signals approach in which zero is assigned to all amplitudes below a specific fraction of the sum of all signals. In the case where all of the detectors' outputs are connected directly to a multichannel Data Acquisition System (DAQ), this approach could be easily applied within a software data processing algorithm. In those situations in which an analog signal processing circuit is used prior to final DAQ, the filtering procedure is preferably done on the hardware level where a biased signal from the analog sum output data readout amplifiers provides a noise rejection feature improving the COG determination accuracy.

The current invention provides a gated truncated readout system circuit rejecting the noise through the use of analog gates-valves, also known as analog switches, instead of amplifier biasing. Amplitude comparators are used to control the analog gates, opening only those gates where the amplitude is above a specific fraction of the total sum of all signals. The circuit thus provides a more accurate analog amplitude filter using a "fraction of sum rejection filter approach". The circuit will work with input signals of any polarity, and has a better linearity for small amplitudes.

The proposed analog readout signal processing circuit considers use of all amplifiers in a linear mode while a truncated COG algorithm is performed using analog gates or switches which are controlled from summing amplifiers along with a logic circuit. The proposed circuit has no initial nonlinearity due to amplifier bias and doesn't change shape or amplitude signals inside the area of interest.

Figure 3:
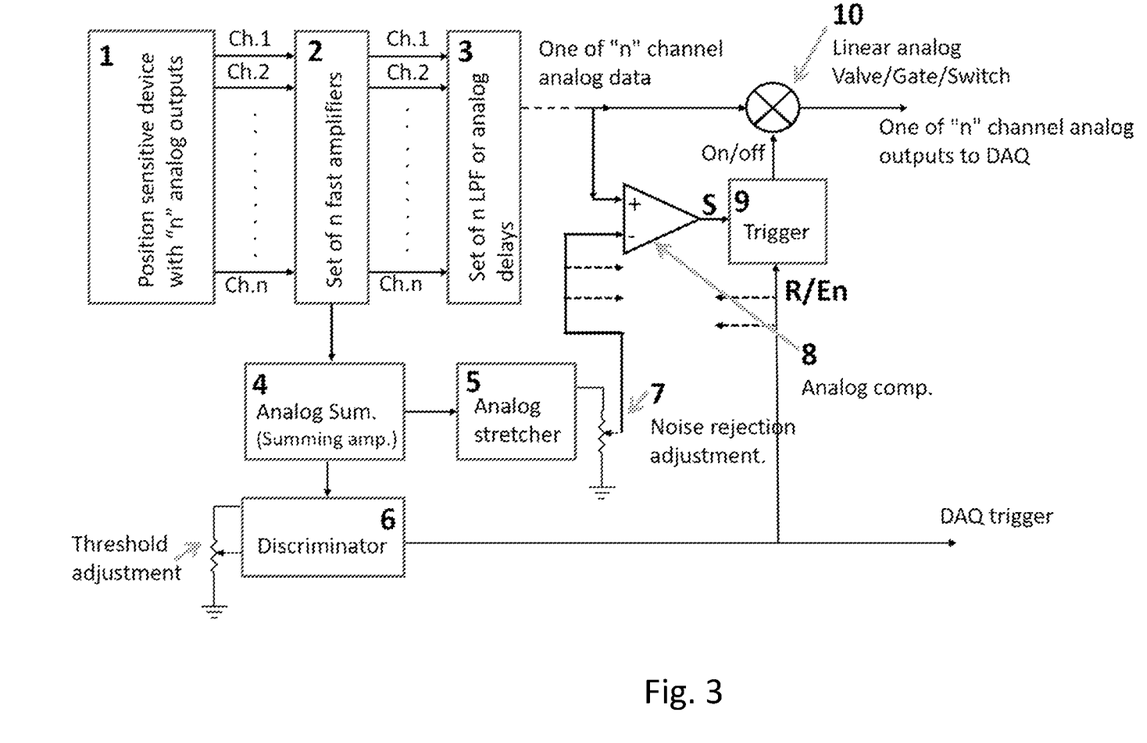
FIG. 3 is a block diagram of analog truncated COG circuit with analog gates controlled from a summing amplifier with the control logic circuit.

With reference to FIG. 3, a device or detector 1 with n analog outputs, hereinafter referred to as a detector 1, is a position sensitive detector with analog outputs labeled Ch.1, Ch.2, . . . Ch.n. The analog outputs carry the detected event position information and a center of gravity algorithm is applied for precision interpolation. An optional input amplifier 2 provides amplification and conditioning of the output signals from the detector 1. In the analog readout signal processing circuit the input amplifier 2 outputs are split, with one output connected to a summing amplifier 4, which provides a sum of all output signals. The ¬input amplifier 2 is also connected to a Low Pass Filter (LPF) that provides a set of analog signal delay amplifiers. The LPF provides a delay to all detector signals before a gate logic signal will be developed, from which the output is sent to an ¬array of n analog delay amplifiers 3. The summing amplifier 4 provides an analog sum of all signals coming from detector 1. The analog sum is then sent to an optional stretcher amplifier 5, which functions is to keep the sum constant during operation of the event logic analog circuit. The stretcher amplifier circuit 5 stretches the output of the sum amplifier for a period of time to enable gate logic signal processing operation with analog delay capability.

The summing amplifier 4 is further connected to a discriminator circuit 6 which discriminates event signals from noise and provides a system control pulse or analog gate enable on the trigger 9. The discriminator circuit 6 provides an amplitude discriminator signal which serves as an event recognition device. The discriminator circuit 6 provides an electronic trigger when the sum amplifier output is above the desired threshold amplitude.

A fraction of sum signal from the optional pulse stretcher 5 is passed to a fraction adjustment divider 7 which is connected to n analog comparators 8, one per each n post amplifier 3. If any of the n post amplifier 3 outputs is above the selected threshold n of the fraction adjustment divider 7 output, it will turn on trigger 9 and open the linear gate/switch 10 to pass the signal through. All signals below the selected threshold will be blocked. The discriminator 6 output pulse also provides an acquisition window. At the end of one event acquisition cycle, R/Enable is set to "off", which resets all triggers thereby closing all open linear gates.

The noise rejection threshold adjustment 7, which is preferably a potentiometer or a dedicated circuit, provides analog threshold data for the gate logic fast analog comparators 8. The meaning of the term "fast comparator" as used herein is a comparator with a low delay time, wherein the meaning of the term "low delay time" is a delay time of less than 100 ns. The fast analog comparators 8, one corresponding to each channel, function to change the output if the channel amplitude is above the noise rejection signal.

The trigger circuit 9 is a two stage electronic circuit which changes the output state for a particular channel if that channel is triggered from the comparator. All triggers are reset at the end of gate logic process prior the next event. The linear gate/switch 10 is an electronic linear/analog switch which provides gating of a specific detector's outputs if permitted by the event gate logic, such as if the current channel amplitude is above the noise rejection threshold. The discriminator output 11 optionally provides an event acquisition time window and could be used for an external Data Acquisition system (DAQ), such as a multichannel ADC device or multichannel DAQ or with a preliminary analog COG weighting circuit.

All analog outputs after applying the gate logic algorithm could be processed directly with the external multichannel DAQ device. Additionally, an advantage could be achieved with an advanced technique for analog signal processing, such as the one proposed in "Analog Readout System with Charge Division Type Output" V. Popov; S. Majewski; A. G. Weisenberger; R. Wojcik, 2001 IEEE Nuclear Science Symposium Conference Record (Cat. No. 01CH37310), which is incorporated herein in its entirety. Adding a next stage of analog signal processing can significantly reduce a number of DAQ connection lines without loss of interpolation accuracy.

The gated truncated readout approach of the present invention eliminates introduction of nonlinear gain or partial amplitude cutting of area of interest pulses. Linear gates or switches controlled with the event logic circuit provide clean filtering/rejection of noise data coming from all inputs where amplitude is below a selected fraction of the sum.

A one event data processing formula according to the invention is:

$$A_i=0 \text{ if } X_i \cdot G < F \cdot \text{Sum; else } A = X_i \cdot G_0 \cdot G_1, \quad (3)$$

where: Sum=$\Sigma X_i \cdot G_0$, $G_0$ is the gain factor of 2 amplifiers, $G_1$ is the gain factor of 3 amplifiers, F—is a selected fraction of Sum, i is the channel index, from 1 to n, where n is the total number of detector device 1 output channels.

Example

An exemplary gated truncated readout system was evaluated with a small gamma camera made of a 4×4 array of R59000008 Hamamatsu photomultiplier tubes coupled to a NaI(Tl) pixelated crystal array. The R59000008 PSPMT is a crosswire anode layout type which is designed for use in the X and Y projection 2D readout configuration. So the camera has a set of two 16X and 16Y outputs.

Figure 4A:
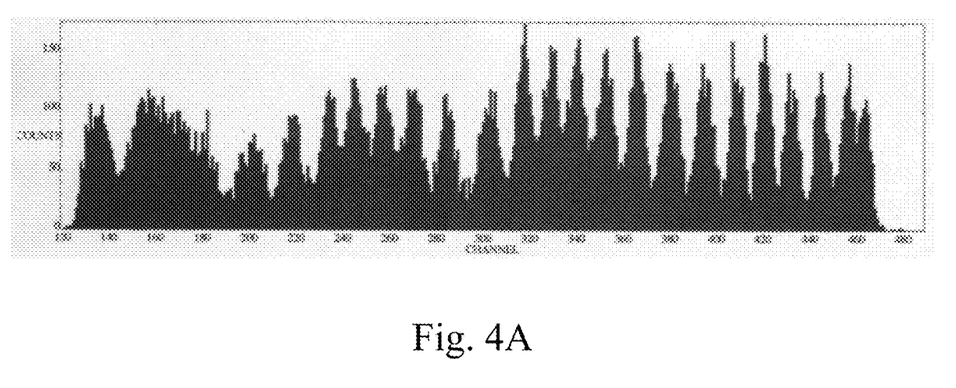
FIG. 4A is a flood image of a one coordinate projection obtained with a gamma camera irradiated with a gamma source, connected to the gated truncated readout system, and with the gating function turned off.
Figure 4B:
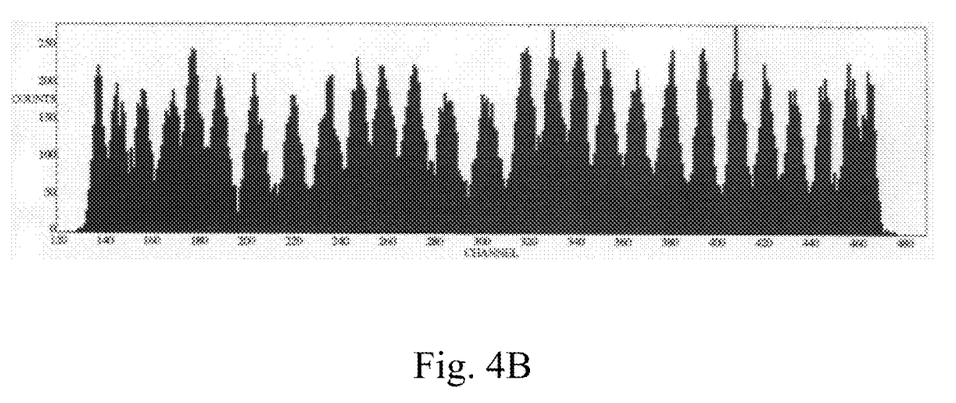
FIG. 4B is a flood image of a one coordinate projection obtained with a gamma camera irradiated with a gamma source, connected to the gated truncated readout system.

Referring to FIGS. 4A and 4B, there are shown flood images of an acquired one coordinate projection with, as in FIG. 4A the gating function off, and, as in FIG. 4B with the gating function on. The flood images of the one coordinate projection are obtained with the gamma camera irradiated with a gamma source and connected to a gated truncated readout system according to the invention. The resolution improvement is most substantially visible on the left side of FIG. 4B as compared with the left side of FIG. 4A. The readout studies indicate a clear improvement in position resolution enhancement.

Figure 5:
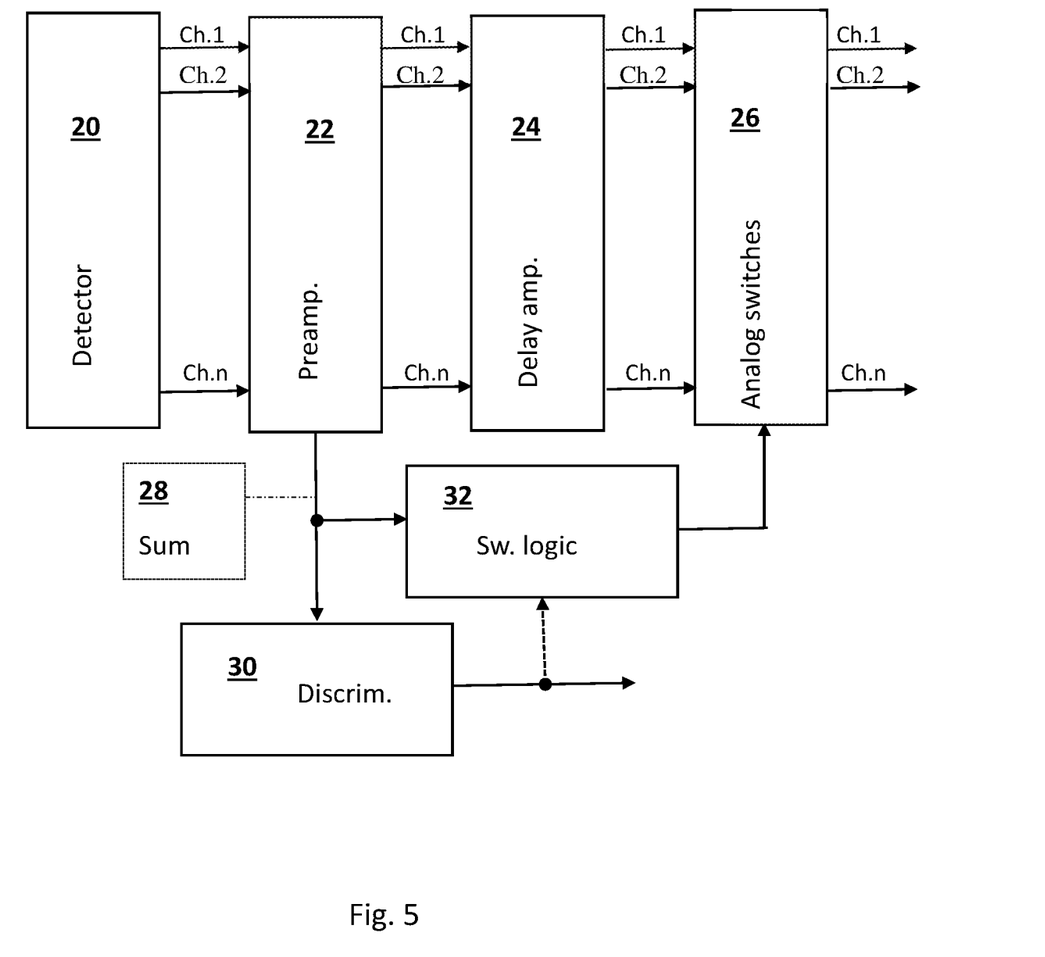
FIG. 5 is a block diagram of a second embodiment of a gated truncated readout system according to the invention.

With reference to FIG. 5, a second embodiment of a gated truncated readout system according to the invention includes a position sensitive detector 20 with n analog outputs labeled Ch.1, Ch.2, . . . Ch.n, a set of n interface-preamplifiers 22, optionally a set of n delays or delay amplifiers 24, and a set of n analog switches or gates 26 each including a control input, and an analog sum output 28. An analog signal proportional to the linear sum of all n amplitudes is provided to an event logic discriminator 30 and to analog switches logic 32. The analog switches logic 32 creates n control signals according to a fraction of the sum signal. The n control signals provide rejection of unwanted low signals and linear passing of signals important for COG determination.

After the set of n analog switches or gates 26 there are n gated analog outputs where noise channels are rejected proportionally to the sum signal, and they could be connected to any external DAQ for COG calculation or can be processed with any analog COG weighting circuit for reducing the number of analog outputs.

The proposed circuit is applicable to a wide range of radiation imaging devices, but, most applicably, to the SiPM or MPPC arrays which are a subject of temperature-dependent random noise. The temperature related noise is a serious problem for large scale sensors. A gated truncated readout system as described herein could be utilized in arrays with high gain uniformity, such as with SiPM or MPPC arrays, and coupled with low input offset comparator integrated circuits in order to improve their position resolution enhancement.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A noise reduction system for providing improved resolution accuracy and better image reconstruction to a data acquisition system (DAQ), comprising:
   a position sensitive device (PSD) with one or more analog output channels;
   a set of analog data delay units, one for each output channel;
   an analog summing amplifier to sum the analog signals of all output channels;
   an analog stretcher circuit to stretch the time duration of the analog sum in order to complete analog signal processing;
   an analog amplitude discriminator including an adjustable threshold to create an event trigger when the sum amplifier output is above the selected threshold amplitude;
   a noise rejection threshold for setting a fraction of sum signal to cut off all data channels having an amplitude below the selected threshold, said noise rejection threshold varying proportionally the sum amplitude;
   a set of analog comparators, one for each signal channel; and
   a set of analog switches each having two states, each of said switches reset by the signal of the analog amplitude discriminator with the state determined by the pulse of the comparator.

2. The noise reduction system of claim 1 comprising:
   a set of analog amplifiers, one for each output channel; and
   said analog amplifiers are optional depending on the strength of the signals in each of the analog output channels.

3. The noise reduction system of claim 1 comprising each of said analog data delay units is a Low Pass Filter (LPF) circuit.

4. The noise reduction system of claim 1 comprising said analog data delay units are selected from the group consisting of simple analog comparator and complex constant fraction discriminator.

5. A method for reducing noise passing from the output channels of a multichannel readout system to a Data Acquisition System (DAQ) thereby improving a Center Of Gravity (COG) determination, comprising:
   providing one or more position sensitive devices (PSD) each having one or more analog output channels;
   connecting an analog amplifier to each of said output channels, said analog amplifiers each receiving an analog signal from a respective output channel of the PSD;
   connecting an analog data delay unit to each of said analog amplifiers to allow time for a linear gate trigger to be processed and signals to pass through the gate without losing amplitude;
   summing the output of all of the output channels with an analog summing amplifier to create an analog sum of all of the output channels;
   stretching the analog sum with an analog stretcher circuit to hold the analog sum for a period of time to complete analog signal processing for each discreet event;
   sending the analog sum from the analog stretcher circuit to a fraction adjustment divider;

connecting an analog comparator and an analog gate to each of the output channels;

setting a fraction of sum signal to cut off all of the output channels having an amplitude below a selected threshold;

passing the fraction of sum signal from the analog stretcher circuit to the fraction adjustment divider and to each of the analog comparators to control each of the analog gates, opening only those gates having an amplitude above a selected fraction of the total sum of all signals;

creating an event trigger with an analog amplitude discriminator including a noise rejection threshold and a fraction of sum signal; and adjusting the noise rejection threshold to suppress noise and start each analog signal processing event.

6. The method of claim 5 comprising said position sensitive devices are selected from the group consisting of single detector with a plurality of analog output channels and array of single detectors with each detector and with each of said single detectors having an analog output channel.

7. The method of claim 5 comprising each of said analog data delay units is a Low Pass Filter (LPF) circuit.

8. The method of claim 5 comprising said analog amplitude discriminator with noise rejection threshold is selected from the group consisting of simple analog comparator and complex constant fraction discriminator.

9. The method of claim 5 comprising said analog amplifiers are optional depending on the strength of the signals in each of the analog output channels.

* * * * *